United States Patent
Croft et al.

[11] Patent Number: 6,064,340
[45] Date of Patent: May 16, 2000

[54] ELECTROSTATIC DISCHARGE LOCATING APPARATUS AND METHOD

[75] Inventors: Gregg D. Croft; Joseph C. Bernier; Rex Lowther, all of Palm Bay, Fla.

[73] Assignee: Intersil Corporation, Palm Bay, Fla.

[21] Appl. No.: 09/108,963

[22] Filed: Jul. 2, 1998

[51] Int. Cl.[7] .............................. G01S 3/02; G01S 31/02
[52] U.S. Cl. ........................................ 342/460; 324/72.5
[58] Field of Search .................................... 342/460, 465; 324/72.5

[56] References Cited

U.S. PATENT DOCUMENTS

| | | | |
|---|---|---|---|
| 2,637,841 | 5/1953 | Davis et al. | 342/460 |
| 2,684,474 | 7/1954 | Kass | 342/460 |
| 5,235,341 | 8/1993 | Effland et al. | 342/460 |
| 5,331,330 | 7/1994 | Susnjara | 342/460 |
| 5,757,322 | 5/1998 | Ray et al. | 342/460 |
| 5,771,020 | 6/1998 | Markson et al. | 342/460 |
| 5,923,160 | 7/1999 | DeChiaro et al. | 324/72.4 |

*Primary Examiner*—Mark Hellner
*Attorney, Agent, or Firm*—Rogers & Killeen

[57] ABSTRACT

An electrostatic discharge locating system may include a plurality of receivers and a central unit. Each receiver may include an antenna. The receivers may receive radio wave signals emanating from an electrostatic discharge event and transmit the signals to the central unit for processing. The central unit may determine the location of an electrostatic discharge event from the relative time of signal reception or the signal amplitudes along with predetermined locations of the receivers.

55 Claims, 5 Drawing Sheets

ELECTROSTATIC DISCHARGE LOCATING APPARATUS AND METHOD

BACKGROUND OF THE INVENTION

Electrostatic discharge remains a problem in many industries. Typically, an electrostatic discharge event occurs when two objects charged to different static potentials come in close proximity to each other and an arc occurs. In the explosives or natural gas production industry, electrostatic discharges may be life threatening. In other industries, electrostatic discharges may cause equipment failure or product damage. To minimize the risk of damage, many manufacturers have implemented various static control precautions. Some known precautions that have been successful in reducing electrostatic discharge events include providing a common ground for all equipment and personnel, installing air ionizers, and replacing common non-conducting materials with special static dissipating materials. Even in facilities that employ precautions, electrostatic discharges may still occur. For example, a grounded piece of equipment may become a potential source of electrostatic discharge if the equipment is moved to a new location without reconnecting the ground connection.

Takai, et al. have published a paper detailing how an antenna may be used to detect electrostatic discharge pulses in an area. See Takai, et al., "One of the Methods of Cbserving ESD around Electronic Equipments." 1996 EOS/ESD Symposium. pp. 186–192. In the Takai, et al. system a small antenna is combined with a recording device to monitor electrostatic discharges. The Takai, et al. system detects and records the time of electrostatic discharge events within a production area. The Takai, et al. paper stated that the number of electrostatic discharge events in the area dropped by ⅓ after improvements were made in grounding the floor. The improvements did not address specific electrostatic discharge problems since the Takai, et al. system can not identify the location of electrostatic problems. Rather, the improvements were general precautions arrived at by using best engineering judgement.

Accordingly, it is an object of the present invention to provide a novel electrostatic discharge locating system and method.

It is another object of the present invention to provide a novel electrostatic discharge precautions surveillance system and method for monitoring and improving the effectiveness of electrostatic discharge precautions employed in an enclosed facility.

It is yet another object of the present invention to provide a novel method and apparatus for detecting electrostatic discharge events in an area using a plurality of receivers coupled to a central processing unit.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
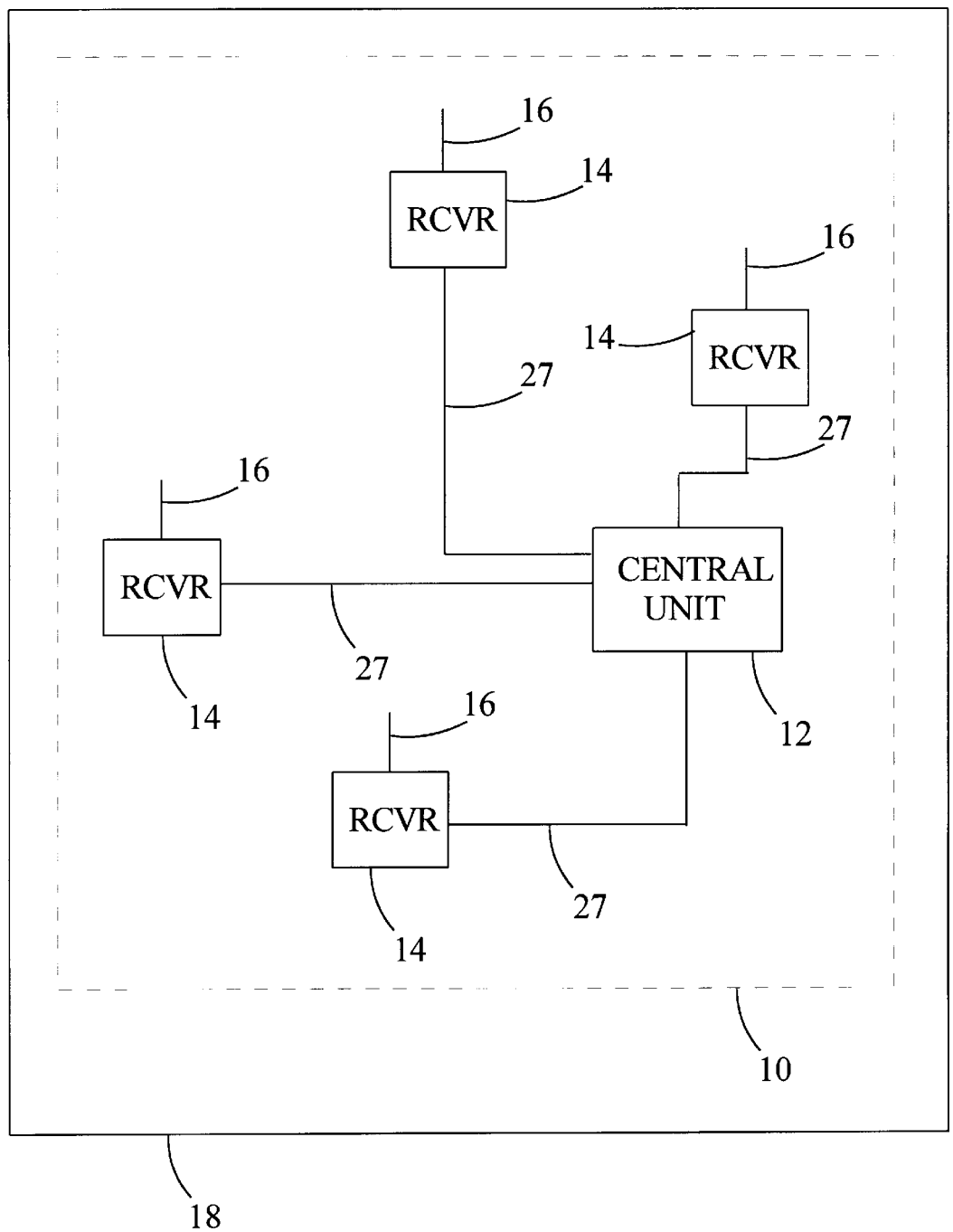
FIG. 1 is a block diagram of a first embodiment of an electrostatic discharge monitoring system of the present invention.

With reference to FIG. 1, electrostatic discharge locating system 10 may include a central unit 12 and a plurality of receivers 14. Each of the receivers 14 may include an antenna 16. The central unit 12 may be operatively coupled to the plurality of receivers 14.

In operation, electrostatic discharge locating system 10 may monitor static discharges in an area 18. Radio waves emanating from an electrostatic discharge event may be receive by the receivers 14 and transmitted to the central unit 12 through cables 27. The central unit 12 may determine the location of a discharge event as a function of the characteristics of the received signals. The specific location of a static event may be used to identify and correct the source of a static problem or to monitor the effectiveness of existing precautions.

Electrostatic discharge generates a broadband signal. The antennas 16 should all be matched in the frequency the antennas 16 are designed to receive. The optimum frequency may be a frequency that provides the best discrimination between an electrostatic discharge event and the existing background electromagnetic radiation in the area to be monitored.

Figure 2:
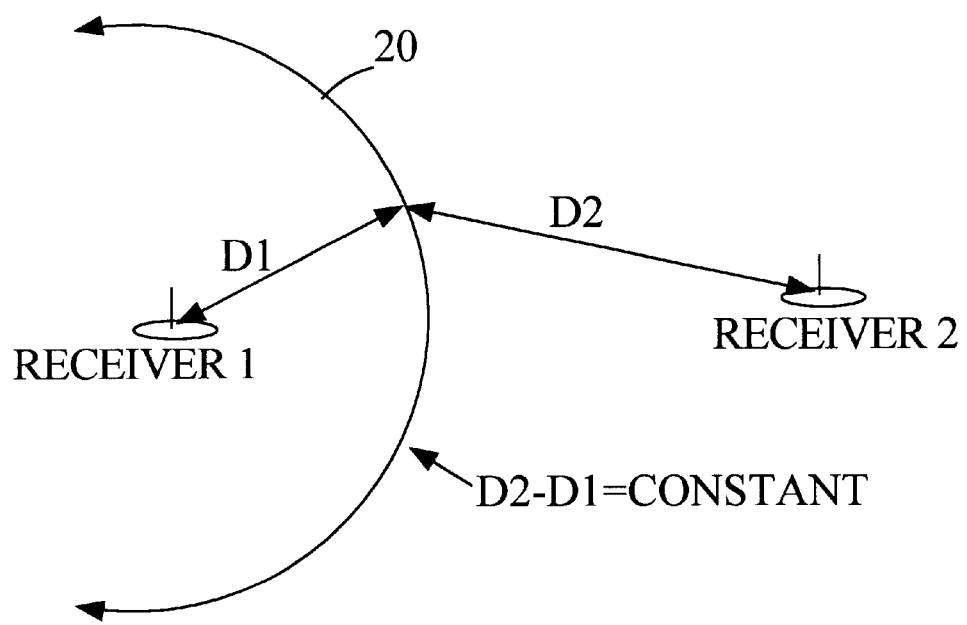
FIG. 2 is a block diagram illustrating hyperbolic analysis of event location.

With reference to FIG. 2, if antenna 1 detects a signal 10 ns before antenna 2 detects the signal, antenna 1 must be approximately 10 feet closer to the signal source than antenna 2. Radio waves travel in air at roughly 1 foot per nanosecond. The relative time of signal reception may define a three dimensional hyperboloid on which the location of the event must lie. A planar-cross-section of the hyperboloid is a hyperbola 20. When multiple antennas are used, the common point of intersection of all the hyperboloids identifies the location of the electrostatic discharge event. Hyperbolic surface equations may be solved simultaneously to determine the common point of intersection. Alternatively, successive approximation techniques may be used to quickly narrow down the location of the event.

In theory, three antennas are sufficient to locate an event in the plane of the antennas, provided that the antennas are not all in the same line. Four antennas are required to uniquely identify an event location in three dimensions, provided that the antennas are non-planar. More than four antennas may be implemented to provide additional data for verifying the accuracy of calculations or for identifying and correcting errors relating to one or more antennas being shielded.

Figure 3:
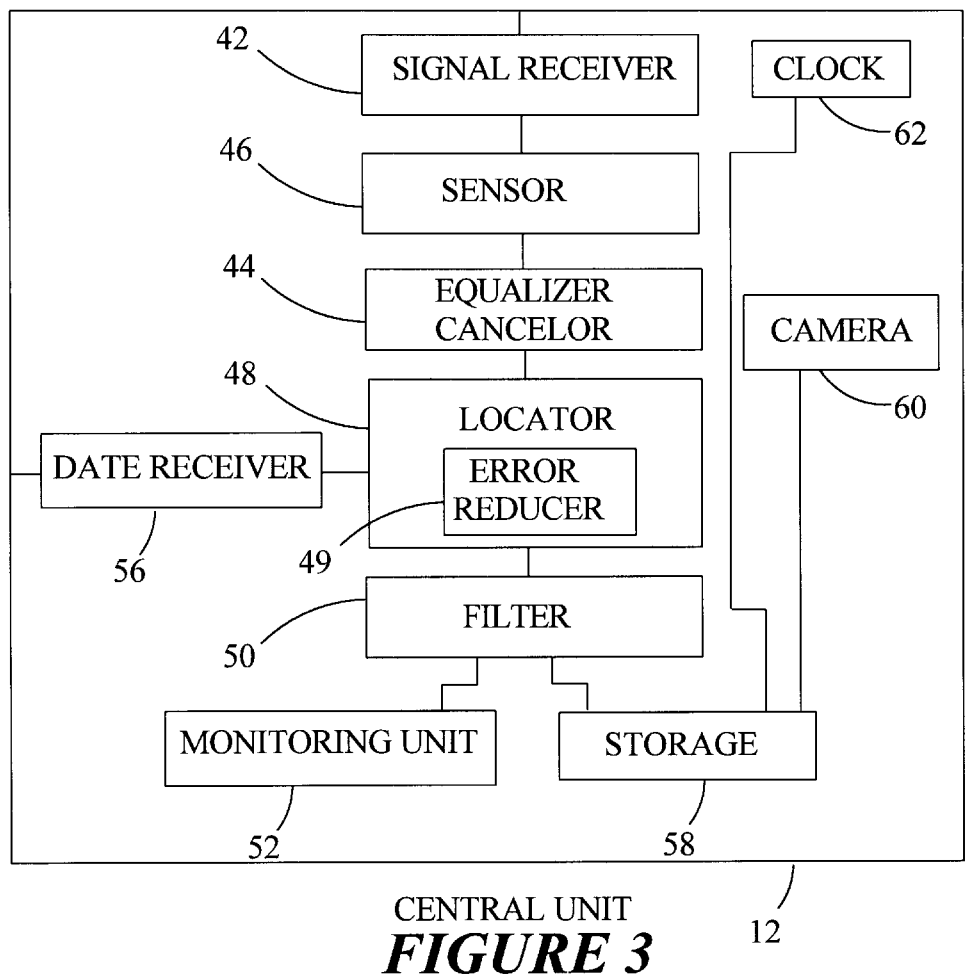
FIG. 3 is a block diagram of one embodiment of a central unit of the present invention.

With reference to FIG. 3, a central unit 12 may include a signal receiver 42, equalizer/canceler 44, sensor 46, locator 48, filter 50, monitoring unit 52, data receiver 56, storage 58, camera 60, and clock 62. The locator 48 may include an error reducer 49. The central unit may be hardware, software, or a combination thereof.

In operation, signals from an electrostatic discharge event may be received by a plurality of receivers (not shown) and transmitted to the central unit 12. The transmitted signals are received at the central unit 12 by the signal receiver 42. Sensor 46 may receive transmitted signals from signal receiver 42. Sensor 46 may sense the relative time of reception of electrostatic discharge event signals. The relative time of reception is defined as the difference in the time of travel of electrostatic discharge event signals from the source of the event to each of the antennas.

Propagation delays from the receivers to the central unit 12 may be equalized by matching length of cables connecting each receiver to the central unit 12. Alternatively, equalizer/canceler 44 may cancel measured propagation delays from the relative time of reception sensed by the sensor 46. To measure the propagation delays, all the receivers may be positioned at the same distance from a known source and the time deltas between the receivers recorded. The equalizer/canceler 44 may add or subtract the measured time deltas from the sensed signals. The measurement and cancelling of the time deltas may be based on any of a number of characteristics of the received signal including the time of the first (or nth) peak of the signal, the time of the nth zero crossing of the signal, the nth time that the signal exceeds a given threshold level, or any characteristic that can be reliably measured.

The locator 48 may receive the equalized or cancelled signal from the equalizer/canceler 44. The data receiver 56 may provide the known locations of the receivers to the locator 48. The locations of the receivers may be fixed during monitoring operation. The locations of the receivers may be varied as long as the new location is provided to the central unit through the data receiver 56. Based on the relative reception times and the location of the receivers in the area being monitored, locator 48 may determine the location of the electrostatic discharge event. The locator 48 may determine the location by implementing an algorithm such as:

1. Guessing the source location. A reasonable initial guess would be near the center of the antenna array.
2. Calculating a function that is minimized when the correct source location (x,y,z) is used.
3. Calculating first and second derivatives of that function with respect to x, y, and z.
4. Using the Newton-Raphson successive approximation method with the derivatives to provide a better guess at the location (x,y,z)(that yields a smaller value of the function).
5. Repeating steps 2–4 with the latest update of (x,y,z) from step 4 until the desired accuracy is achieved.
6. If acceptable convergence is not achieved, a different initial guess may be used and the process repeated. A reasonable alternative to guessing a point in the center of the array is to guess the location at the midpoint of one of the lines connecting two of the antennas.
7. If acceptable convergence is still not achieved after using several different initial guesses, then at least one of the antennas may not be receiving a direct line of site signal and therefore the location may not be able to be calculated using this antenna grouping.

For any guessed location, the relative time difference for each pair of antennas may be determined from the known location of the antennas. The function being minimized may be the sum over all pairs of the square of the difference between the guessed location and observed time differences. Newton-Raphson's method may be used to find the location where all the first derivatives of the function are equal to zero (i.e., the point where the function in the algorithm may be minimized).

In a manufacturing area, electrostatic discharge events may occur in locations surrounded by large grounded machinery. The machinery may effectively block the transmission of radio waves. If an antenna is blocked from receiving a direct line of sight signal, reflected signals may still be received. A reflected signal will be delayed in time and have a lower magnitude than the direct signal. If one or more antennas in a four antenna system are blocked the location determined by the locator 48 may be far off from the actual location of the event. The accuracy and reliability of the locator 48 may be improved by an error reducer 49 and/or by increasing the number of antennas.

The error reducer 48 may group the antennas into multiple sets. A locator 46 having an error reducer 48 may independently determine an event location from signals received from each set of antennas. If the location determined from two or more sets of antennas are within a given distance of each other (within the measurement resolution of the system), a high probability exists that an accurate location has been determined. If a location from another set of antennas is different (outside a given distance), then one or more of the antennas in that set may be blocked. For example, a locating system may have six antennas grouped into fifteen distinct sets of four antennas. If one of the six antennas is blocked, the location determined from five of the fifteen sets will approximately be the same. The other ten sets which include the blocked antenna may provide erroneous results, if any results at all.

Filter 50 receives event location information from the locator 48 and filters the information to ignore known static sources that are considered unimportant such as light switches, door knobs, or electric motors. The locations of unimportant sources may be provided to the filter 50 and any detected events within a given distance of those locations may be discounted. The storage device 58 may receive event location information from the filter 50. Clock 62 may be triggered to provide the time of electrostatic discharge events to the storage device 58.

The central unit 12 may include a still or video camera 60 that covers the same work area as the monitoring system. The camera 60 may provide visual indication of the person, item, machine, or activity that may have caused an electrostatic discharge strike. As a result of detecting an event, the camera 60 may be triggered to operate or a camera image may be time stamped. Images may be stored with a time stamp in storage device 58.

Monitoring unit 52 may receive event location information from filter 50. The monitoring unit 52 may be triggered or updated based upon the detection of events. The monitoring unit 52 may display a map of the area being monitored with superimposed red dots representing detected events. The size of the dots may correspond to the relative amplitude of the electrostatic discharges. The dots may be time stamped. The monitoring unit 52 may trigger an alarm when a given number of strikes over a given time frame occur or when the amplitude of any individual strike is above a certain threshold.

Figure 4:
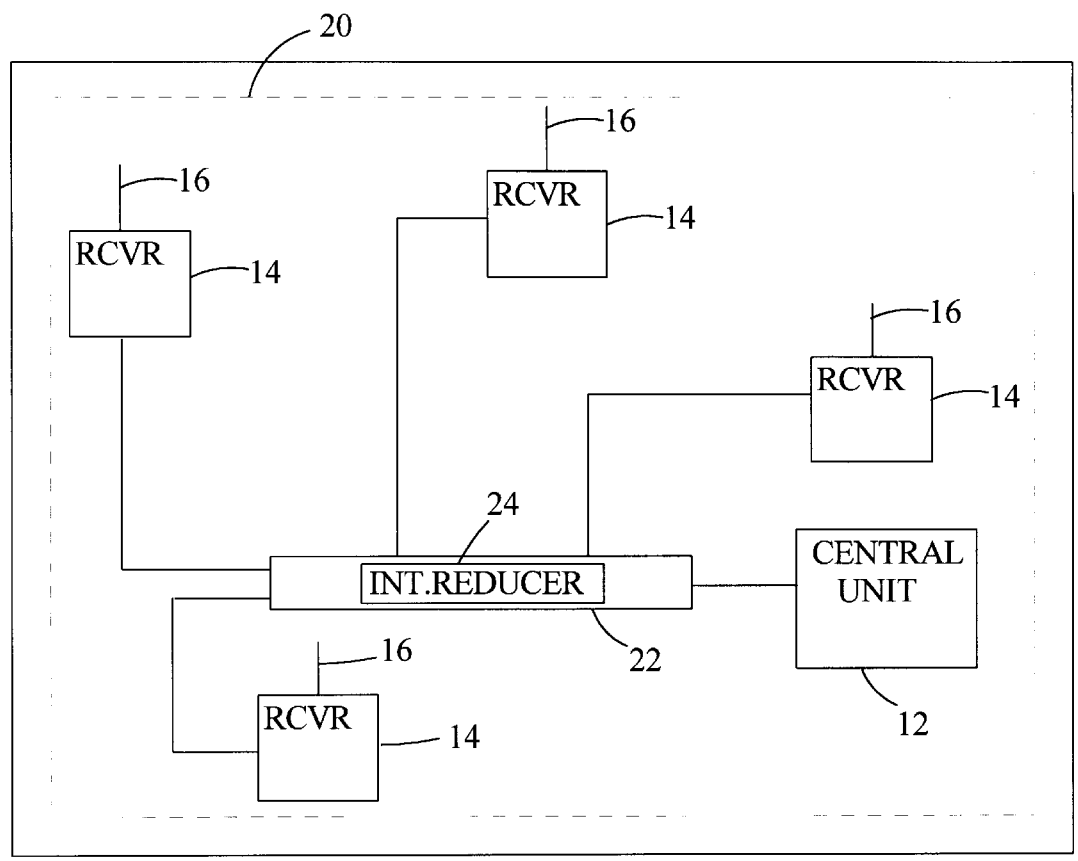
FIG. 4 is a block diagram of a second embodiment of an electrostatic discharge monitoring system of the present invention.

With reference to FIG. 4, electrostatic discharge monitoring system 20 may include a central unit 12, a plurality of receivers 14 and a measurement channel 22. Each receiver may include an antenna 16. The measurement channel 22 may include an interference reducer 24. All the receivers may be operatively connected to the measurement channel 22.

In operation, signals received by the receivers are transmitted to the central unit 12 through the measurement channel 22 (e.g., a signal transmission channel). To prevent interference between signals in the measurement channel 22, interference reducer 24 may delay each signal to separate signals from each other by a known amount of time. The added delay of the signal from one of two antennas connected to the same channel must be larger than the signal travel time from one antenna to the other plus the expected settling time of the signal. An example would be two antennas connected to the same measurement channel and separated by 50 feet. The delay added to one of the signals must be greater than approximately 50 ns (relative difference in time of reception) plus the expected settling time of the signal which may be 200 ns. As long as the magnitude of the added delay is precisely known, the delay may be subtracted from the received signal by the central unit and the location of the discharge event determined.

An alternative method for measuring the time delays may be to measure and compare the amplitudes of the signals received by multiple antennas. The difference in signal amplitudes may provide positional information. To determine event location based on signal amplitude, the antenna and gain stage of the receivers are to be well matched or, in the alternative, the antennas and gain stages may be calibrated to correct mismatches. The calibration may be performed by placing all of the antennas at the same distance from a known source and measuring and recording the amplitudes of the received signal.

A low signal amplitude may indicate a blocked line of sight to the electrostatic discharge event. Antennas receiving signals of a very low signal strength may be blocked and may be eliminated from calculations. Alternatively, once a location is determined, expected signal amplitudes may be determined from the known locations of each antenna. Antennas receiving markedly lower signal amplitudes than expected may be removed from the pool of valid data and the determination of the location repeated.

Figure 5:
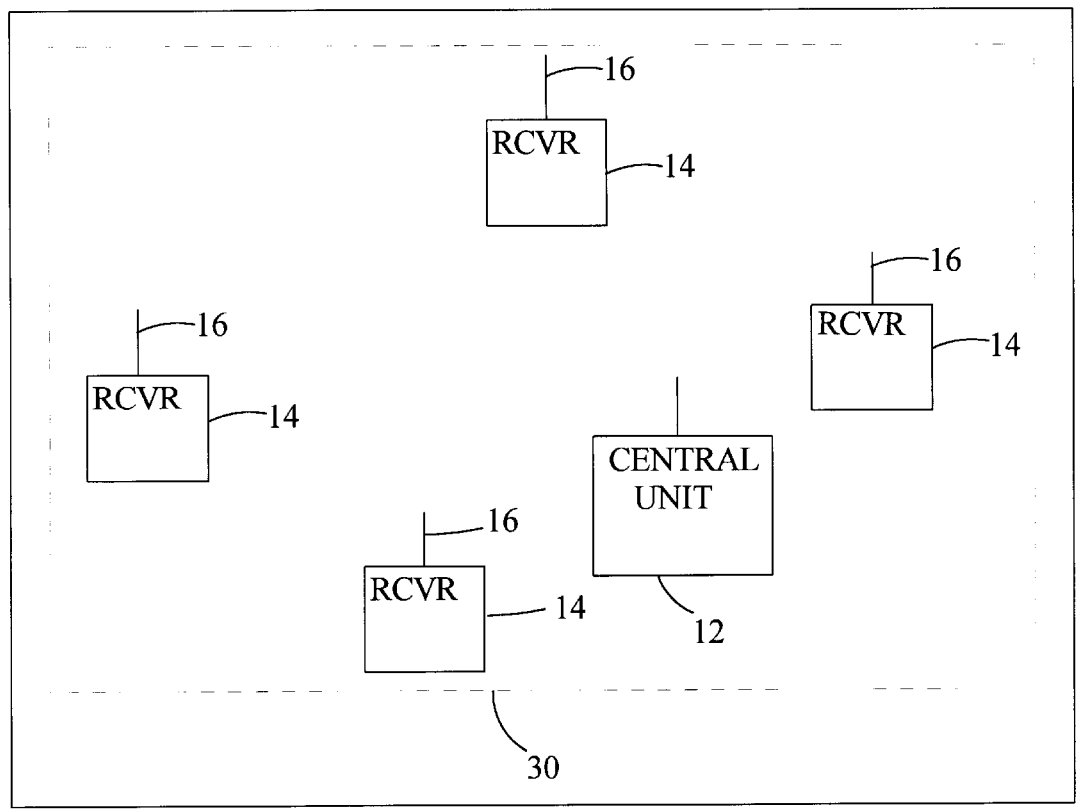
FIG. 5 is a block diagram of a third embodiment of an electrostatic discharge monitoring system of the present invention.

With reference to FIG. 5, an electrostatic discharge monitoring system 30 may include a wireless transmission system whereby the receivers 14 transmit to the central unit 12 either a repeat of the received signal or another signal that indicates a feature of the received signal. Features of the transmission may include a burst of a given duration or frequency which contains information on a property of the detected signal. The time delay added to the system by the wireless transmission system may have to be measured and calibrated out of the total system 30.

The antennas may be arranged in the area to be monitored to achieve different results. The antennas 16 may be arranged to provide equal coverage over the entire area. The antennas 16 may be arranged to maximize the effectiveness of detection in areas of particular interest, such as a product handling workbench. The antennas 16 may be arranged to maximize the direct line of sight to a work area. The antennas 16 may be arranged near a work bench to maximize the number of antennas that detect events at a sensitive location.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. An electrostatic discharge locating system for locating an electrostatic discharge event comprising:
   (a) a plurality of receivers at spaced apart locations within a predetermined area adapted to receive an electromagnetic signal emanating from an electrostatic discharge event in said area, each of said plurality of receivers including a gain stage and each gain stage having an approximately equal gain; and
   (b) a central unit operatively connected to said plurality of receivers having:
      data input means for receiving data identifying the location of each of said plurality of receivers,
      signal input means for receiving the received electromagnetic signals from said plurality of receivers,
      sensing means responsive to said signal input means for sensing a characteristic of the received electromagnetic signals, and
      locating means responsive to said sensing means and said data input means for determining in real time the location of the electrostatic discharge event as a function of the sensed characteristic of the electromagnetic signals and the receiver locations,
      whereby the electromagnetic signal emanating from the electrostatic discharge event is received by said plural receivers and provided to the central unit, and
      whereby said central unit determines the location of the electrostatic discharge event as a function of the characteristic and the receiver locations.

2. An electrostatic discharge locating system for locating an electrostatic discharge event comprising:
   (a) a plurality of receivers at spaced apart locations within a predetermined area adapted to receive an electromagnetic signal emanating from an electrostatic discharge event in said area; and
   (b) a central unit operatively connected to said plurality of receivers having:
      data input means for receiving data identifying the location of each of said plurality of receivers,
      signal input means for receiving the received electromagnetic signals from said plurality of receivers,
      sensing means responsive to said signal input means for sensing a characteristic of the received electromagnetic signals,
      equalizing means for equalizing the delay in signal propagation of the received electromagnetic signal from each of said receivers to said sensing means, and
      locating means responsive to said sensing means and said data input means for determining in real time the location of the electrostatic discharge event as a function of the sensed characteristic of the electromagnetic signals and the receiver locations,
      whereby the electromagnetic signal emanating from the electrostatic discharge event is received by said plural receivers and provided to the central unit, and
      whereby said central unit determines the location of the electrostatic discharge event as a function of the characteristic and the receiver locations.

3. An electrostatic discharge locating system for locating an electrostatic discharge event comprising:
   (a) a plurality of receivers at spaced apart locations within a predetermined area adapted to receive an electromagnetic signal emanating from an electrostatic discharge event in said area; and
   (b) a central unit operatively connected to said plurality of receivers having:
      data input means for receiving data identifying the location of each of said plurality of receivers,
      signal input means for receiving the received electromagnetic signals from said plurality of receivers,
      sensing means responsive to said signal input means for sensing a characteristic of the received electromagnetic signals,
      canceling means for canceling the delay in signal propagation of the received electromagnetic signal from said receivers to said sensing means, and locating means responsive to said sensing means and said data input means for determining in real time the location of the electrostatic discharge event as a function of the sensed characteristic of the electromagnetic signals and the receiver locations, whereby the electromagnetic signal emanating from the electrostatic discharge event is received by said plural receivers and provided to the central unit, and whereby said central unit determines the location of the electrostatic discharge event as a function of the characteristic and the receiver locations.

4. An electrostatic discharge locating system for locating an electrostatic discharge event comprising:

(a) at least four receivers at spaced apart locations within a predetermined area adapted to receive an electromagnetic signal emanating from an electrostatic discharge event in said area; and (b) a central unit operatively connected to said plurality of receivers having:

data input means for receiving data identifying the location of each of said plurality of receivers, signal input means for receiving the received electromagnetic signals from said plurality of receivers, sensing means responsive to said signal input means for sensing a characteristic of the received electromagnetic signals, and locating means responsive to said sensing means and said data input means for determining in real time the location of the electrostatic discharge event as a function of the sensed characteristic of the electromagnetic signals and the receiver locations, said locating means including an error reduction means for minimizing inaccuracy in determining the location of the electrostatic discharge event due to a direct line of receiver reception being shielded, whereby the electromagnetic signal emanating from the electrostatic discharge event is received by said plural receivers and provided to the central unit, and whereby said central unit determines the location of the electrostatic discharge event as a function of the characteristic and the receiver locations.

5. An electrostatic discharge locating system for locating an electrostatic discharge event comprising:

(a) a plurality of receivers at spaced apart locations within a predetermined area adapted to receive an electromagnetic signal emanating from an electrostatic discharge event in said area; and (b) a central unit operatively connected to said plurality of receivers having:

data input means for receiving data identifying the location of each of said plurality of receivers, signal input means for receiving the received electromagnetic signals from said plurality of receivers, sensing means responsive to said signal input means for sensing a characteristic of the received electromagnetic signals, said sensing means sensing the relative detection times of the electromagnetic signals at said receivers to less than a nanosecond, and locating means responsive to said sensing means and said data input means for determining in real time the location of the electrostatic discharge event as a function of the sensed characteristic of the electromagnetic signals and the receiver locations, whereby the electromagnetic signal emanating from the electrostatic discharge event is received by said plural receivers and provided to the central unit, and whereby said central unit determines the location of the electrostatic discharge event as a function of the characteristic and the receiver locations.

6. An electrostatic discharge locating system for locating an electrostatic discharge event comprising:

detection means including at least four receivers for detecting at a plurality of locations in a predetermined area electromagnetic signals emanating from an electrostatic discharge event and including accuracy means for minimizing inaccuracy in determining the location of the discharge event due to a blocked line of sight between some of said receivers and the discharge event; and locating means responsive to said detecting means for determining the location of the electrostatic discharge event as function of the electromagnetic signals.

7. An electrostatic discharge precautions surveillance system for monitoring and improving the effectiveness of electrostatic discharge precautions employed in an enclosed facility, comprising:

(a) detections means including a plurality of antennas within the facility adapted to receive broadband electrical signals emanating from an electrostatic discharge event in the facility, each of said plurality of antennas being tuned to approximately the same frequency, the frequency being selected from within the broadband of frequencies emanating from the discharge event so that the electrical signals received at each of said plurality of antennas have approximately the same frequency; and (b) a central unit responsive to said detection means for rapidly identifying a source of the electrostatic discharge event in the facility to thereby monitor and improve the effectiveness of existing electrostatic discharge precautions in the facility.

8. A method for determining the location of an electrostatic discharge event comprising the steps of:

(a) providing a plurality of receivers for receiving electromagnetic radiation at plural sites within a predetermined area;

(b) matching the gain stages of the receivers;

(c) receiving at the plural sites electromagnetic radiation emanating from an electrostatic discharge event;

(d) providing the received radiation to a central unit; and (e) determining the location of the electrostatic discharge event at the central unit as a function of a signal characteristic of the received electromagnetic radiation.

9. A method for determining the location of an electrostatic discharge event comprising the steps of:

(a) receiving at plural sites within a predetermined area electromagnetic radiation emanating from an electrostatic discharge event;

(b) providing the received radiation signal to a central unit;

(c) equalizing signal propagation delay between the plurality of sites and the central unit; and (d) determining the location of the electrostatic discharge event it the central unit as a function of a signal characteristic of the received electromagnetic radiation.

10. A method for determining the location of an electrostatic discharge, event comprising the steps of:

(a) receiving at plural sites within a predetermined area electromagnetic radiation emanating from an electrostatic discharge event;

(b) providing the received radiation signal to a central unit;

(c) measuring signal propagation delays between the plurality of sites and the central unit;

(d) canceling the propagation delays; and
(e) determining the location of the electrostatic discharge event as a function of a signal characteristic of the received electromagnetic radiation.

11. A method for determining the location of an electrostatic discharge event comprising the steps of:
(a) providing at least four receiver sites within a predetermined area for receiving electromagnetic radiation emanating from an electrostatic discharge event;
(b) determining the location of the electrostatic discharge event as a function of a signal characteristic of the received electromagnetic radiation; and
(c) minimizing the inaccuracy associated with determining the location of the discharge event due to blocked line of sight between some of the plurality of receiver sites and the discharge event causing the receipt of reflected signals rather than line of sight signals at the blocked receiver sites.

12. The system of claim 1 wherein the characteristic is the relative time of reception of the received electromagnetic signals at said plurality of receivers.

13. The system of claim 1 wherein the characteristic is the amplitude of the received electromagnetic signals.

14. The system of claim 1 wherein each of sa d plurality of receivers is tuned to receive on approximately the same frequency.

15. The system of claim 2 wherein each receiver includes an antenna.

16. The system of claim 15 comprising at least three of said antennas not being co-linear.

17. The system of claim 15 comprising at least four of said antennas not being co-planar.

18. The system of claim 3 wherein said central unit includes a time of day means responsive to said signal input means for determining the time of day occurrence of the electrostatic discharge event.

19. The system of claim 8 wherein said central unit includes a storage means for storing the time of day and the determined location of the electrostatic discharge event.

20. The system of claim 12 wherein said locating means determines the location of the electrostatic discharge event with successive approximation to determine a unique point in the predetermined area from the sensed relative time of reception of the received electromagnetic signals.

21. The system of claim 12 wherein said locating means determines the location of the electrostatic discharge event with hyperbolic analysis of the sensed relative time of reception of the received electromagnetic signals.

22. The system of claim 4 wherein said locating means includes a means for performing a numerical algorithm to determine the location of the discharge event.

23. The system of claim 5 further comprising a measurement channel means for delivering the received electromagnetic signals from said receivers to said central unit; and interference reduction means for minimizing inter-receiver interference within said measurement channel means.

24. The system of claim 1 wherein said plurality of receivers are arranged to maximize the direct line of sight reception coverage of the predetermined area.

25. The system of claim 2 wherein said plurality of receivers are arranged to concentrate coverage on electrically sensitive areas.

26. The system of claim 3 wherein said plurality of receivers are selectively positioned to concentrate coverage on an area selected as a function of prior electromagnetic events.

27. The system of claim 7 wherein said central unit includes a visual recording device for recording images of the predetermined area.

28. The system of claim 27 wherein said central unit includes a means for storing the recorded images with time of day occurrence of any sensed electrostatic discharge event.

29. The system of claim 4 wherein said central unit includes a filtering means for ignoring predetermined sources of electrostatic discharge.

30. The system of claim 5 further comprising a monitoring unit for displaying the determined location of the electrostatic discharge event.

31. The system of claim 5 further comprising a monitoring unit for displaying a status of a signal characteristic.

32. The system of claim 23 wherein said interference reduction means comprises a delay buffer for providing different delays for received electromagnetic signals from each of said receivers.

33. The electrostatic discharge locating system of claim 6 wherein said detection means comprises an antenna at each of the plurality of locations.

34. The electrostatic discharge locating system of claim 6 wherein said detection means comprises at least three non-collinear antenna.

35. The electrostatic discharge locating system of claim 6 wherein said detection means comprises at least four non-planar antennas.

36. The electrostatic discharge precautions surveillance system of claim 7 wherein said central unit includes means for determining, recording, and displaying the time and location of the electrostatic discharge event based on the signals received at the antennas.

37. The electrostatic discharge precautions surveillance system of claim 7 wherein said central unit includes a means for determining the location of the electrostatic discharge event as function of the relative time of reception of the signals by said plurality of antennas.

38. The electrostatic discharge precautions surveillance system of claim 7 wherein said central unit determines the location of the electrostatic discharge event by successive approximation to determine a unique point in the predetermined area as a function of the relative time of reception of the signals.

39. The electrostatic discharge precautions surveillance system of claim 7 wherein said central unit determines the location of the electrostatic discharge event by hyperbolic analysis of the relative time of reception of the signals.

40. The electrostatic discharge precautions surveillance system of claim 7 wherein said central unit includes a means for determining the location of electrostatic discharge event as a function of the amplitude of the received signals by said plurality of antennas.

41. The method of claim 8 further comprising the step of positioning the plurality of sites in predetermined locations within the predetermined area.

42. The method of claim 8 further comprising the step of tuning each receiver to approximately the same frequency.

43. The method of claim 8 further comprising the step of providing site locations to the central unit.

44. The method of claim 10 further comprising the step of providing an antenna for each of the plurality of sites.

45. The method of claim 10 wherein the step of providing an antenna includes the step of providing at least three non-collinear antennas.

46. The method of claim 44 wherein the step of providing an antenna includes the step of providing at least four non-planar antennas.

47. The method of claim 9 further comprising the step of recording the determined location of the discharge event.

48. The method of claim 9 wherein the step of determining the location includes the steps of evaluating the amplitude of signals received by each of the plurality of antennas and determining the location of the discharge event as a function of the amplitude of signals received.

49. The method of claim 44 further comprising the step of positioning the antennas to maximize the direct line sight between the sites and the location of potential discharge events.

50. The method of claim 44 further comprising the step of positioning the antennas to concentrate coverage on sensitive areas.

51. The method of claim 11 further comprising the step of recording images of the predetermined area over time.

52. The method of claim 11 wherein said step of recording images of the predetermined area over time includes the step of stamping the images with the time of occurrence of the discharge event.

53. The electrostatic discharge locating system of claim 6, wherein said means for minimizing inaccuracy in determining the location of the discharge event due to a blocked line of sight includes an error reducer that groups the receivers into sets of three or more receivers.

54. The system of claim 7, further comprising a means for determining the frequency of the existing background electromagnetic radiation in the area being monitored so that the frequency being monitored by each of said plurality of antennas is selected to discriminate between the electrostatic discharge event and the background radiation.

55. The method of claim 11, wherein said step (c) includes grouping the receiver sites into sets of three or more receiver sites.

* * * * *